US008080829B2

(12) United States Patent
Lin et al.

(10) Patent No.: US 8,080,829 B2
(45) Date of Patent: Dec. 20, 2011

(54) LIGHT-EMITTING DIODE DEVICE INCLUDING A MULTI-FUNCTIONAL LAYER

(75) Inventors: Chih-Sheng Lin, Tainan County (TW);
Che-Hsiung Wu, Tainan County (TW)

(73) Assignee: Ubilux Optoelectronics Corporation, Tainan County (TW)

( * ) Notice: Subject to any disclaimer, the term of this patent is extended or adjusted under 35 U.S.C. 154(b) by 161 days.

(21) Appl. No.: 12/685,350

(22) Filed: Jan. 11, 2010

(65) Prior Publication Data

US 2010/0176413 A1    Jul. 15, 2010

(30) Foreign Application Priority Data

Jan. 12, 2009   (TW) .............................. 98100944 A

(51) Int. Cl.
*H01L 33/00* (2010.01)
(52) U.S. Cl. ............ 257/98; 257/E33.068; 257/E21.158
(58) Field of Classification Search .................... 257/98, 257/E33.068, E21.158
See application file for complete search history.

(56) References Cited

U.S. PATENT DOCUMENTS

| 7,075,115 | B2* | 7/2006 | Sakamoto et al. | 257/98 |
| 7,132,691 | B1* | 11/2006 | Tanabe et al. | 257/79 |
| 7,910,941 | B2* | 3/2011 | Chen et al. | 257/98 |

* cited by examiner

*Primary Examiner* — Wai Sing Louie
*Assistant Examiner* — Bilkis Jahan
(74) *Attorney, Agent, or Firm* — Marsh Fischmann & Breyfogle LLP

(57) ABSTRACT

A light-emitting diode device includes: a substrate; a light-emitting layered structure formed on the substrate; a multi-functional layer having a first main portion and formed on the light-emitting layered structure for spreading current laterally and for reflecting light emitted from the light-emitting layered structure; and first and second electrodes electrically coupled to the light-emitting layered structure. The first electrode is formed on the light-emitting layered structure and has a first electrode main part. The first main portion of the multi-functional layer is aligned below and is provided with a size larger than that of the first electrode main part.

41 Claims, 17 Drawing Sheets

LIGHT-EMITTING DIODE DEVICE INCLUDING A MULTI-FUNCTIONAL LAYER

CROSS-REFERENCE TO RELATED APPLICATION

This application claims priority of Taiwanese application No. 098100944, filed on Jan. 12, 2009.

BACKGROUND OF THE INVENTION

1. Field of the Invention

This invention relates to a light-emitting diode device, more particularly to a semiconductor light-emitting diode device including a multi-functional layer.

2. Description of the Related Art

Referring to FIG. 1, a conventional semiconductor light-emitting diode device includes a substrate 11, a buffer layer 12, a n-type cladding layer 13, an active layer 14, a p-type cladding layer 15, a current spreading layer 16, a p-type electrode 17, and an n-type electrode 18 formed on an exposed portion of the n-type cladding layer 13. When a working voltage is applied to the semiconductor light-emitting diode device through the p-type and n-type electrodes 17, 18, light resulting from recombination of electrons and holes in the active layer 14 is generated. However, the light emitted upwardly and toward the p-type electrode 17 is blocked by the p-type electrode 17. In addition, a bottom of the p-type electrode 17 which is usually made from a light-absorbing material may absorb the light, thereby decreasing the light output power and light-emitting efficiency.

Referring to FIG. 2, for improvement over the aforesaid semiconductor light-emitting diode device, a semiconductor light-emitting diode device having a structure similar to that of the conventional semiconductor light-emitting diode device is further provided with a reflective layer 19 which is formed within the current spreading layer 16, and is as large as the p-type electrode 17. The reflective layer 19 includes at least two sub-layers made from different materials. A top sub-layer of the reflective layer 19 is made of a conductive material and a bottom sub-layer of the reflective layer 19 is made of an insulating material having light reflectivity. The p-type electrode 17 is disposed over the reflective layer 19. The reflective layer 19 is provided for reflecting light emitted from the active layer 14 below the p-type electrode 17. However, since the reflective layer 19 is provided with a size as large as the p-type electrode 17, a sidelight (indicated by the arrow A) can not be reflected by the reflective layer 19 and is absorbed by the p-type electrode 17. Moreover, when the p-type electrode 17 deviates from the reflective layer 19 during manufacturing, the light emitted from the active layer 14 below the p-type electrode 17 is still absorbed by the p-type electrode 17. Therefore, alignment of the p-type electrode 17 with the reflective layer 19 is required to be precise. In case of disalignment, the current from the p-type electrode 17 can flow through the current spreading layer 16 to a region of the active layer 14 beneath the p-type electrode 17, thereby reducing the effect of spreading the current flow.

SUMMARY OF THE INVENTION

Therefore, an object of the present invention is to provide a light-emitting diode device that can increase the light-emitting efficiency.

Another object of the present invention is to provide a method of making the light-emitting diode device.

According to one aspect of the present invention, a light-emitting diode device comprises: a substrate; a light-emitting layered structure formed on the substrate; a multi-functional layer having a first main portion and formed on the light-emitting layered structure for spreading current laterally and for reflecting light emitted from the light-emitting layered structure; and first and second electrodes electrically coupled to the light-emitting layered structure. The first electrode is formed on the light-emitting layered structure and has a first electrode main part. The first main portion of the multi-functional layer is aligned below and is provided with a size larger than that of the first electrode main part.

According to another aspect of the present invention, a method of making a light-emitting diode device comprises: (a) forming a light-emitting layered structure on a substrate; (b) forming a multi-functional layer on the light-emitting layered structure, the multi-functional layer having a first main portion; (c) forming a first electrode on the multi-functional layer, the first electrode having a first electrode main part that is aligned above and provided with a size smaller than that of the first main portion; and (d) forming a second electrode electrically coupled to the light-emitting layered structure.

Preferably, the first main portion of the multi-functional layer protrudes beyond the first electrode main part to a first distance not larger than 65% of a geometric radius of the first electrode main part. If the first distance is too large, the area of the multi-functional layer is increased so that it can block the upwardly emitting light, thereby reducing illumination of the light-emitting diode device. A maximum of the first distance may be 13 μm, and a minimum of the geometric radius of the first electrode main part may be 20 μm.

The light-emitting layered structure further comprises a reflective layer aligned below the second electrode. The second electrode has a second electrode main part. The reflective layer has a second main portion. Likewise, the second main part protrudes beyond the second electrode main part to a third distance not larger than 65% of a geometric radius of the second electrode main part. A maximum of the third distance may be 13 μm, and a minimum of the geometric radius of the second electrode main part may be 20 μm.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
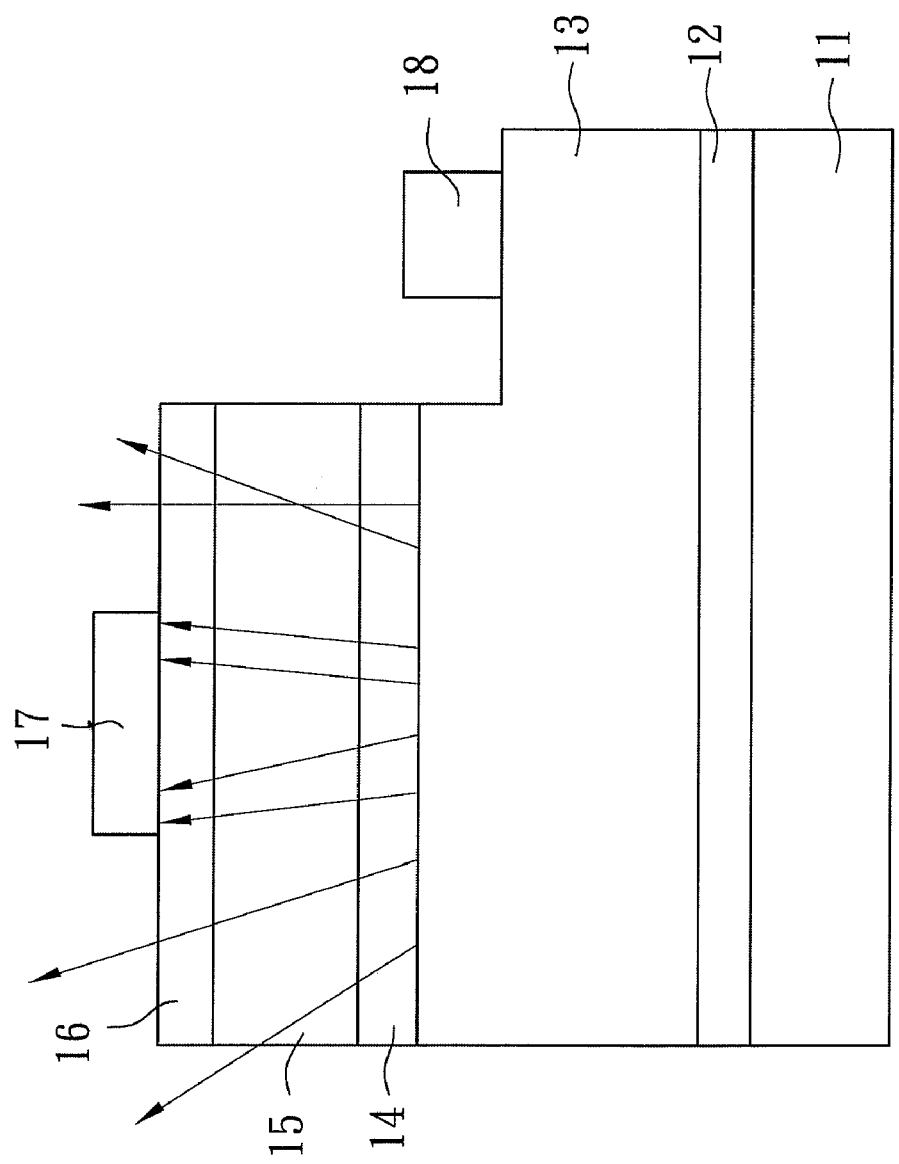
FIG. 1 is a schematic diagram of a conventional light-emitting diode device.
Figure 2:
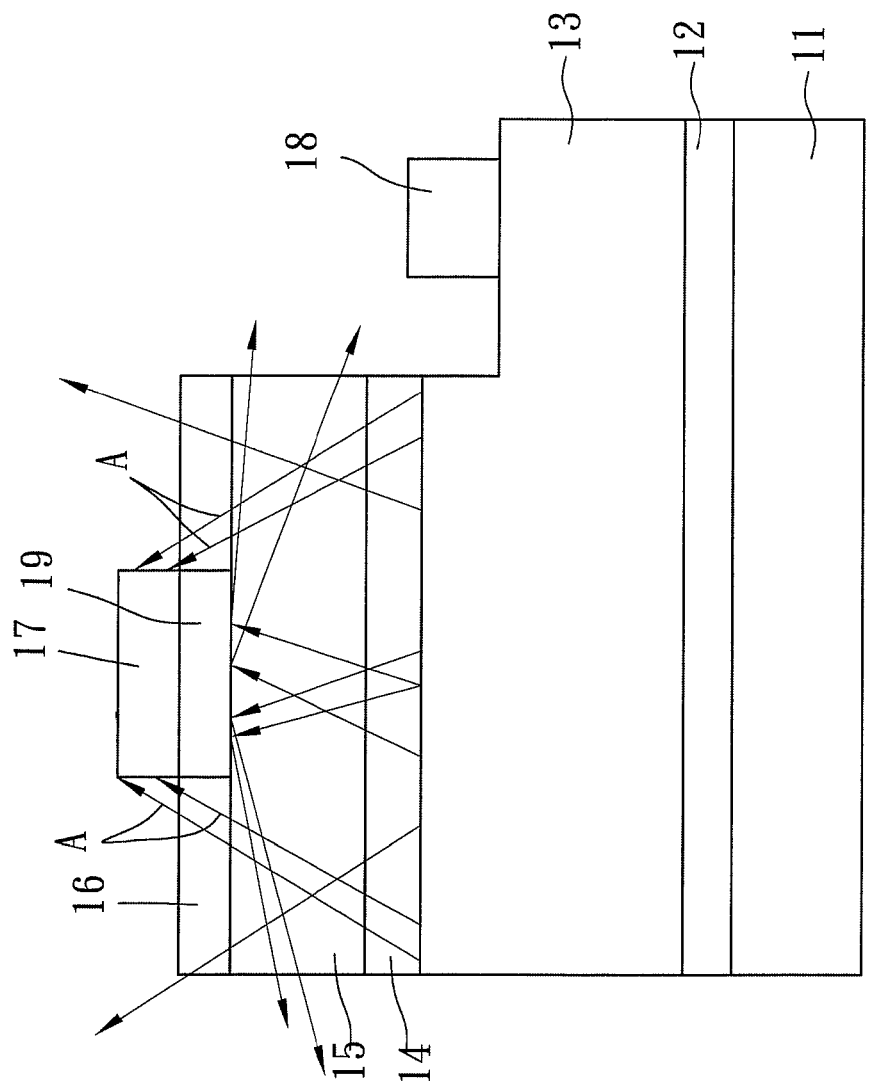
FIG. 2 is a schematic diagram of another conventional light-emitting diode device.

Before the present invention is described in greater detail with reference to the accompanying preferred embodiments, it should be noted herein that like elements are denoted by the same reference numerals throughout the disclosure.

Figure 3:
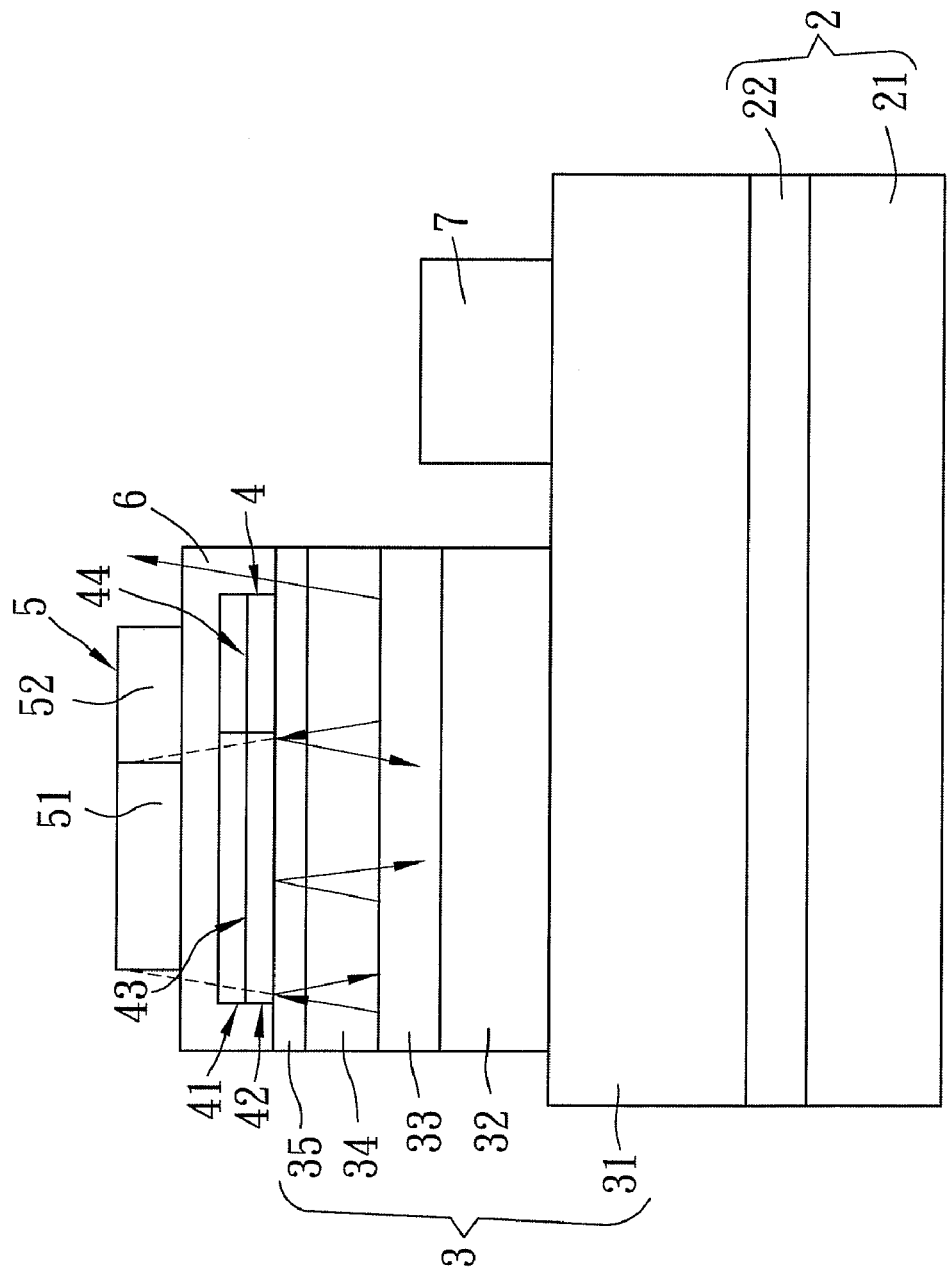
FIG. 3 is a schematic diagram of the first preferred embodiment of a light-emitting diode device according to this invention.
Figure 4:
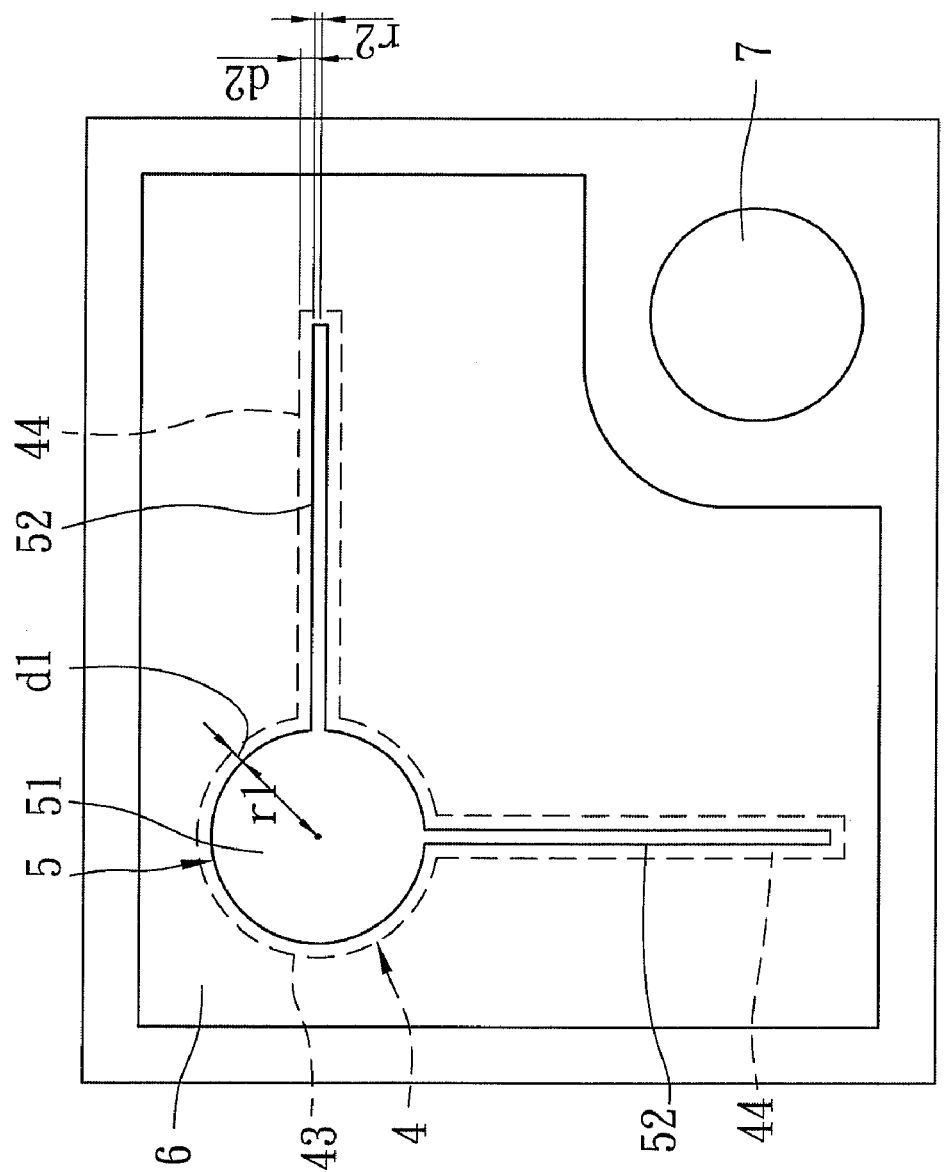
FIG. 4 is a plan view of the first preferred embodiment.

Referring to FIGS. 3 and 4, a light-emitting diode device of the first preferred embodiment according to this invention includes a substrate 2, a light-emitting layered structure 3, a multi-functional layer 4, a first electrode 5, a current spreading layer 6, and a second electrode 7. Note that drawings in FIGS. 3 and 4 do not completely correspond to each other because FIG. 3 is to demonstrate only layers of the light-emitting diode device stacked along a vertical direction, and FIG. 4 is to show only the position of the multi-functional layer 4 relative to the first electrode 5.

The substrate 2 includes a base layer 21 and a buffer layer 22 formed on the base layer 21. In this embodiment, the base layer 21 is made from sapphire.

The light-emitting layered structure 3 is formed on the buffer layer 22 of the substrate 2 and includes a first contact layer 31, a first cladding layer 32, an active layer 33, a second cladding layer 34, and a second contact layer 35 in sequence.

In this embodiment, the first contact layer 31 is made of an n-type semiconductor material, and is formed on a surface of the buffer layer 22. The second electrode 7 is made of a metal, and is formed on an exposed portion of and in ohmic contact with the first contact layer 31. Electron and holes are recombined in the active layer 33. The second cladding layer 34 is made of a p-type semiconductor material. The second contact layer 35 is made of a p-type semiconductor material and is formed on the second cladding layer 34.

The multi-functional layer 4 is formed on the second contact layer 35 and includes a bottom sub-layer 42 proximate to the light-emitting layered structure 3 and a top sub-layer 41 away from the light-emitting layered structure 3. The bottom sub-layer 42 is made of a metal having light reflectivity. The top sub-layer 41 is made of an oxide of the metal. In this embodiment, the bottom sub-layer 42 is made of aluminum (Al), and the top sub-layer 41 is made of aluminum oxide ($Al_2O_3$).

Moreover, the multi-functional layer 4 further includes a first main portion 43 and two first extension portions 44 projecting from the first main portion 43 along a horizontal plane. In this embodiment, the first main portion 43 is round in shape, and each of the first extension portions 44 is formed as a strip.

The current spreading layer 6 is disposed between the second contact layer 35 and the first electrode 5 and wholly covers the multi-functional layer 4. The current spreading layer 6 is made of a conductive transparent oxide material, such as indium tin oxide (ITO), for facilitating to spread current uniformly and downwardly.

The first electrode 5 is formed on the current spreading layer 6 and includes a first electrode main part 51 aligned above the first main portion 43 and two first electrode extension parts 52 aligned above the first extension portions 44, respectively. The first electrode extension parts 52 serve to assist in spreading uniform current. The first main portion 43 has a shape corresponding to and a size larger than that of the first electrode main part 51, and protrudes beyond the first electrode main part 51 to a first distance (d1). The first main portion 43 can be circular, square, oval, polygonal, or irregular in shape.

Likewise, each of the first extension portions 44 has a shape corresponding to and a size larger than that of the respective first electrode extension part 52, and protrudes beyond the respective first electrode extension part 52 to a second distance (d2).

Figure 5:
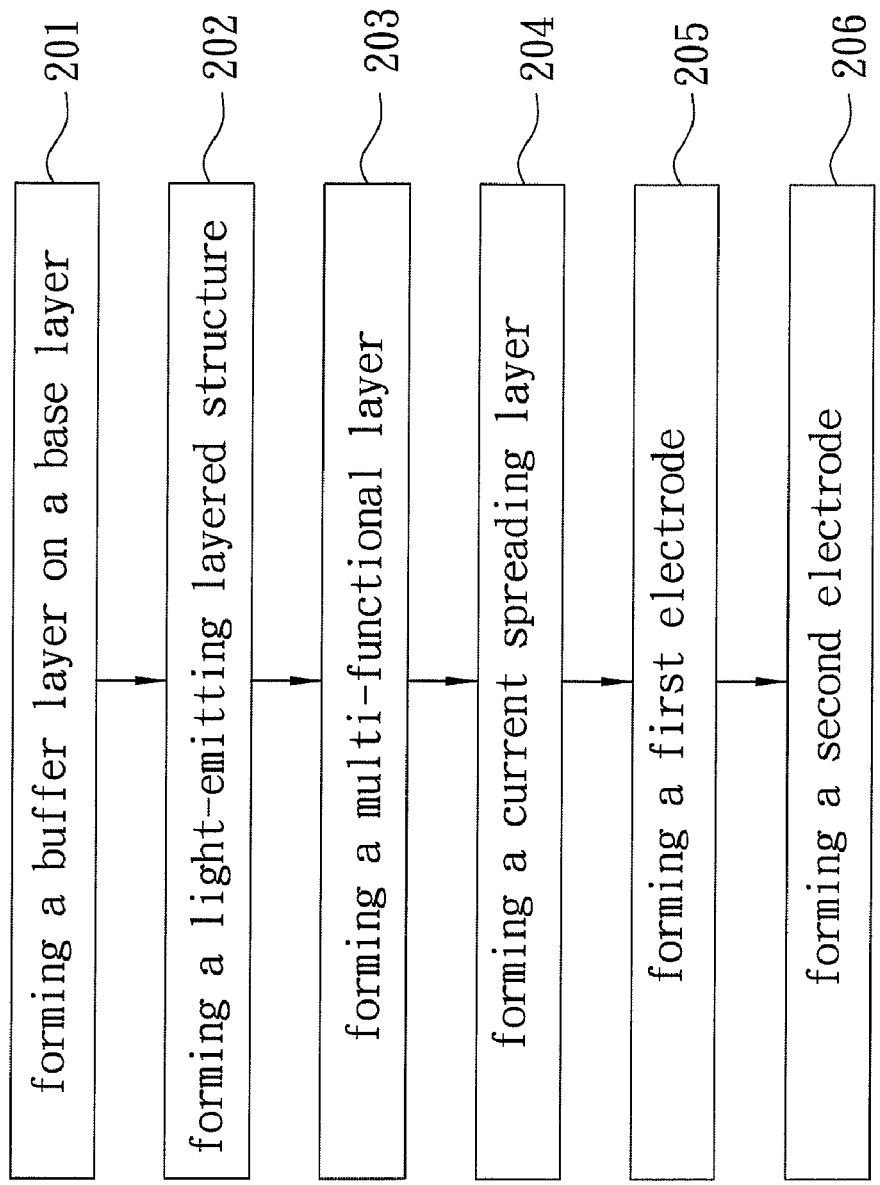
FIG. 5 is a flowchart to illustrate consecutive steps of the method of making the first preferred embodiment of the light-emitting diode device according to this invention.

Referring to FIGS. 3 to 5, a method of making the light-emitting diode device according to this invention includes steps 201 to 206.

In step 201, the substrate 2 is provided and includes the base layer 21 and the buffer layer 22 formed on the base layer 21.

In step 202, the light-emitting layered structure 3 is formed on the buffer layer 22. The light-emitting layered structure 3 includes the first contact layer 31, the first cladding layer 32, the active layer 33, the second cladding layer 34, and the second contact layer 35.

In step 203, the multi-functional layer 4 is formed. First, a metal film of aluminum (Al) is deposited on the second contact layer 35 and then is subjected to an oxygen plasma treatment or a thermal treatment under an oxygen environment such that a surface of the metal film is oxidized to form an oxide film of aluminum oxide ($Al_2O_3$). The non-oxidized metal film (Al) serves as the bottom sub-layer 42 and the oxide film ($Al_2O_3$) serves as the top sub-layer 41. The first main portion 43 and the first extension portions 44 are therefore formed.

In step 204, the current spreading layer 6 is formed on the second contact layer 35 and wholly covers the multi-functional layer 4.

In step 205, the first electrode 5 is formed on the current spreading layer 6 and has the first electrode main part 51 aligned above the first main portion 43 and the first electrode extension parts 52 respectively aligned above the first extension portions 44 such that the first electrode 5 is situated entirely within the area of the multi-functional layer 4.

In step 206, portions of the first contact layer 31 are exposed for growth of the second electrode 7 thereon. The second electrode 7 is electrically coupled to the first cladding layer 32 through the first contact layer 31.

Figure 6:
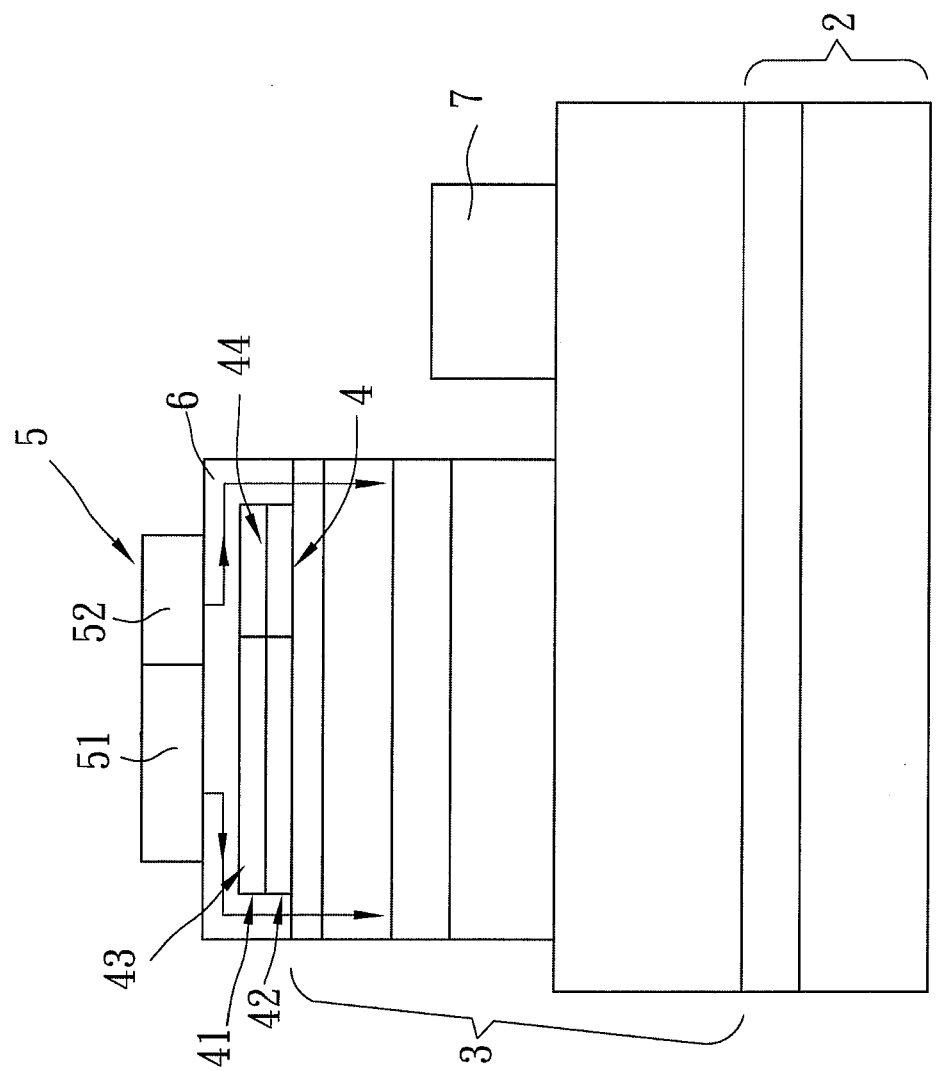
FIG. 6 is the same view as FIG. 3, but illustrating an applied current flow.

Referring to FIGS. 3, 4 and 6, in operation, when a working voltage is applied, an applied current uniformly and downwardly flows from the current spreading layer 6 to the multi-functional layer 4. Since the top sub-layer 41 is made of an insulating material and can block the current from flowing therethrough, the applied current (indicated by the arrow in FIG. 6) will spread laterally to the regions around the top sub-layer 41, thereby preventing the current from flowing into the active layer 33 through a region beneath the first electrode 5.

The light (indicated by the arrow in FIG. 3) generated in the active layer 33 and emitted toward the first electrode 5 is reflected by the bottom sub-layer 42 made of a metal having good reflectivity. In addition, due to an enlarged design of the multi-functional layer 4 where the first main and extension portions 43, 44 project from the first electrode main and extension parts 51, 52, the light is prevented from being absorbed by the first electrode 5, thereby increasing light-emitting efficiency.

Experiments

In the experiments, Samples 1-5 (S1-5) corresponding to the first preferred embodiment shown in FIGS. 3 and 4, and Comparative Sample 1 (CS1) are prepared. The experiments are performed using the working voltage of 20 mA to evaluate the light output power of the samples. The multi-functional layer 4 of Comparative Sample 1 differs from that of Samples 1-5 in the first and second distances (d1, d2). The first and second distances of Comparative Sample 1 are zero (d1=0, d2=0), which indicates that the multi-functional layer 4 is the same size as the first electrode 5. For each of Sample 1-5, the first and second distances (d1, d2) are the same.

TABLE 1

|  | CS1 | S1 | S2 | S3 | S4 | S5 |
|---|---|---|---|---|---|---|
| d1 (µm) | 0 | 3 | 5 | 7 | 9 | 12 |
| % = (d1/r1) × 100% | 0 | 8.6% | 14.3% | 20.0% | 25.7% | 34.3% |
| d2 (µm) | 0 | 3 | 5 | 7 | 9 | 12 |
| % = (d2/r2) × 100% | 0 | 100% | 166.7% | 233.3% | 300% | 400% |
| Light output power (mW) | 9.15 | 9.33 | 9.5 | 9.59 | 9.53 | 9.35 | r1 = 35 µm, r2 = 3 µm

Figure 7:
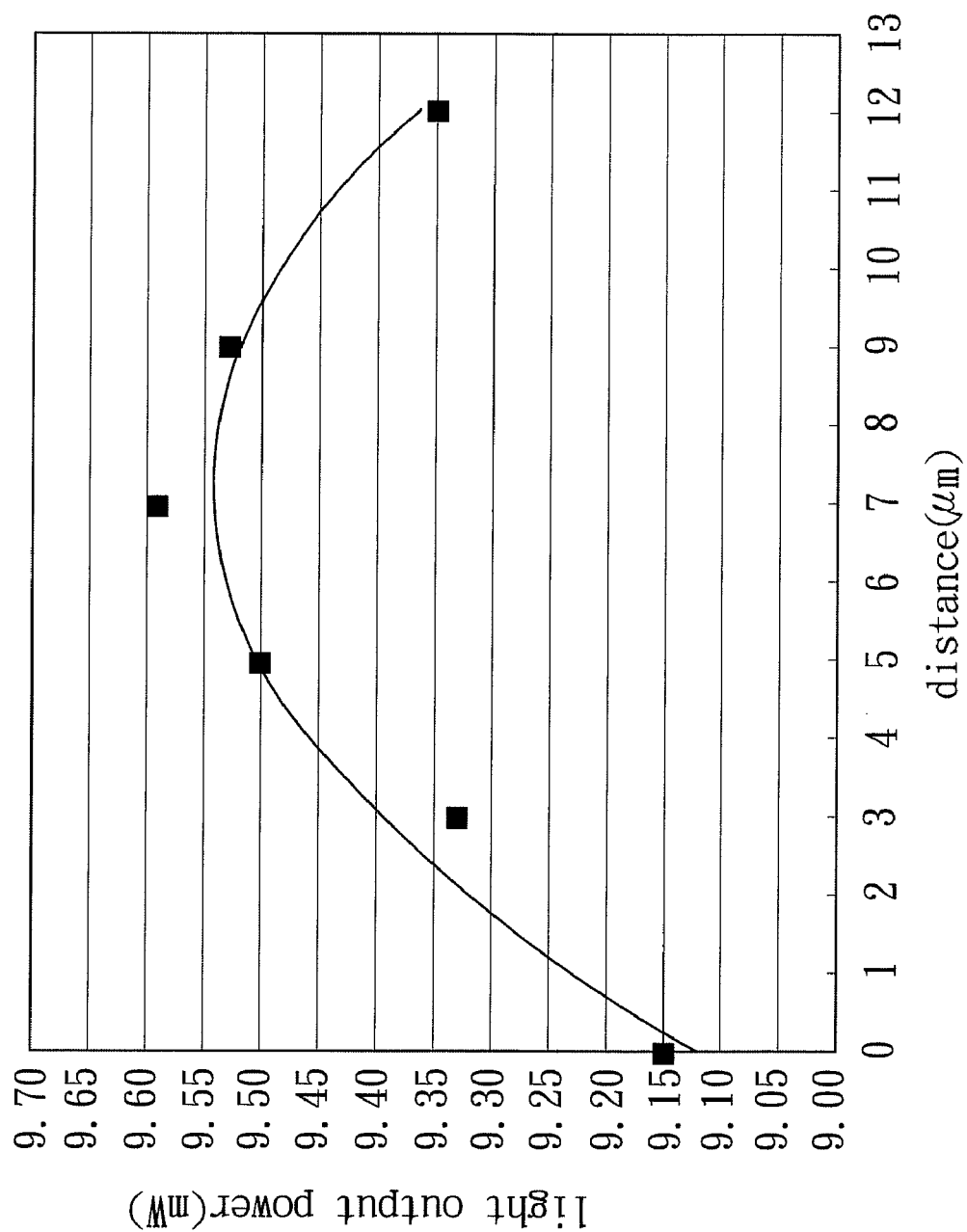
FIG. 7 is a plot of first and second distances versus light output power of the first preferred embodiment.

Referring to Table 1 and FIG. 7, the results show that Comparative Sample 1 (d1=0, d2=0) has a light output power of 9.15 mW. In Sample 1, when the first and second distances (d1, d2) are 3 µm, the light output power is increased to 9.33 mW, which is an increase of about 2% ((9.33-9.15)/9.15× 100%=2%) compared to that of Comparative Sample 1. The light output power of each of Samples 2-5 is also increased compared to that of Comparative Sample 1.

When the first and second distances (d1, d2) are too small, the multi-functional layer 4 has a small reflective area so that the light emitted toward the first electrode 5 will not be reflected efficiently and the current blocking effect is poor. When the first and second distances (d1, d2) are too large, the multi-functional layer 4 has an overly large area such that a light-emitting area will be reduced, thereby adversely affecting the light illumination. Therefore, the first distance (d1) may range from 2 µm to 13 µm, more preferably, from 3 µm to 12 µm, and most preferably, from 5 µm to 9 µm. Likewise, the second distance (d2) may range from 2 µm to 13 µm, more preferably, from 3 µm to 12 µm, and most preferably, from 5 µm to 9 µm.

The results further show that when the first and second distances (d1, d2) range from 2 µm to 13 µm, the light output power has more than 2% increase as compared to that of Comparative Sample 1. When the first and second distances (d1, d2) range from 5 µm to 9 µm, the light output power has more than 3.8% increase as compared to that of Comparative Sample 1.

Alternatively, the first distance (d1) can be defined by a percentage of a geometric radius of the first electrode main part 51. The term "geometric radius" used herein refers to a distance from a geometric center of a geometric profile to a boundary of the geometric profile. In this embodiment, the geometric radius (r1) of the first electrode main part 51 is 35 µm. In sample 1, the first distance (d1) is 3 µm which is 8.6% (3/35×100%=8.6%) of the geometric radius (r1). Therefore, according to this invention, the first distance (d1) ranges from 5.7% to 37.1% (from 2 µm to 13 µm) of the geometric radius (r1), more preferably, from 8.6% to 34.3% (from 3 µm to 12 µm) of the geometric radius (r1), and most preferably, from 14.3% to 25.7% (from 5 µm to 9 µm) of the geometric radius (r1).

Likewise, the second distance (d2) can be defined by a percentage of a geometric radius (r2) of each of the first electrode extension parts 52. In this embodiment, the geometric radius (r2) of each of the first electrode extension parts 52 is 3 µm. Therefore, the second distance (d2) ranges from 66.7% to 433.3% (from 2 µm to 13 µm) of the geometric radius (r2), more preferably, from 100% to 400% (from 3 µm to 12 µm) of the geometric radius (r2), and most preferably, from 166.7% to 300% (from 5 µm to 9 µm) of the geometric radius (r2).

By virtue of the multi-functional layer 4 protruding beyond the first electrode 5, a current blocking effect can be obtained and the applied current can spread laterally and uniformly toward the light-emitting layered structure 3. In addition, the multi-functional layer 4 is provided for reflecting light emitted toward the first electrode 5 such that the light will not be absorbed by the first electrode 5, thereby increasing light-emitting efficiency. The multi-functional layer 4 of the present invention has a size larger than that of the first electrode 5, which has an advantage in that the first electrode 5 can be entirely included in the multi-functional layer 4 even when the first electrode 5 slightly deviates from the multi-functional layer 4.

Figure 8:
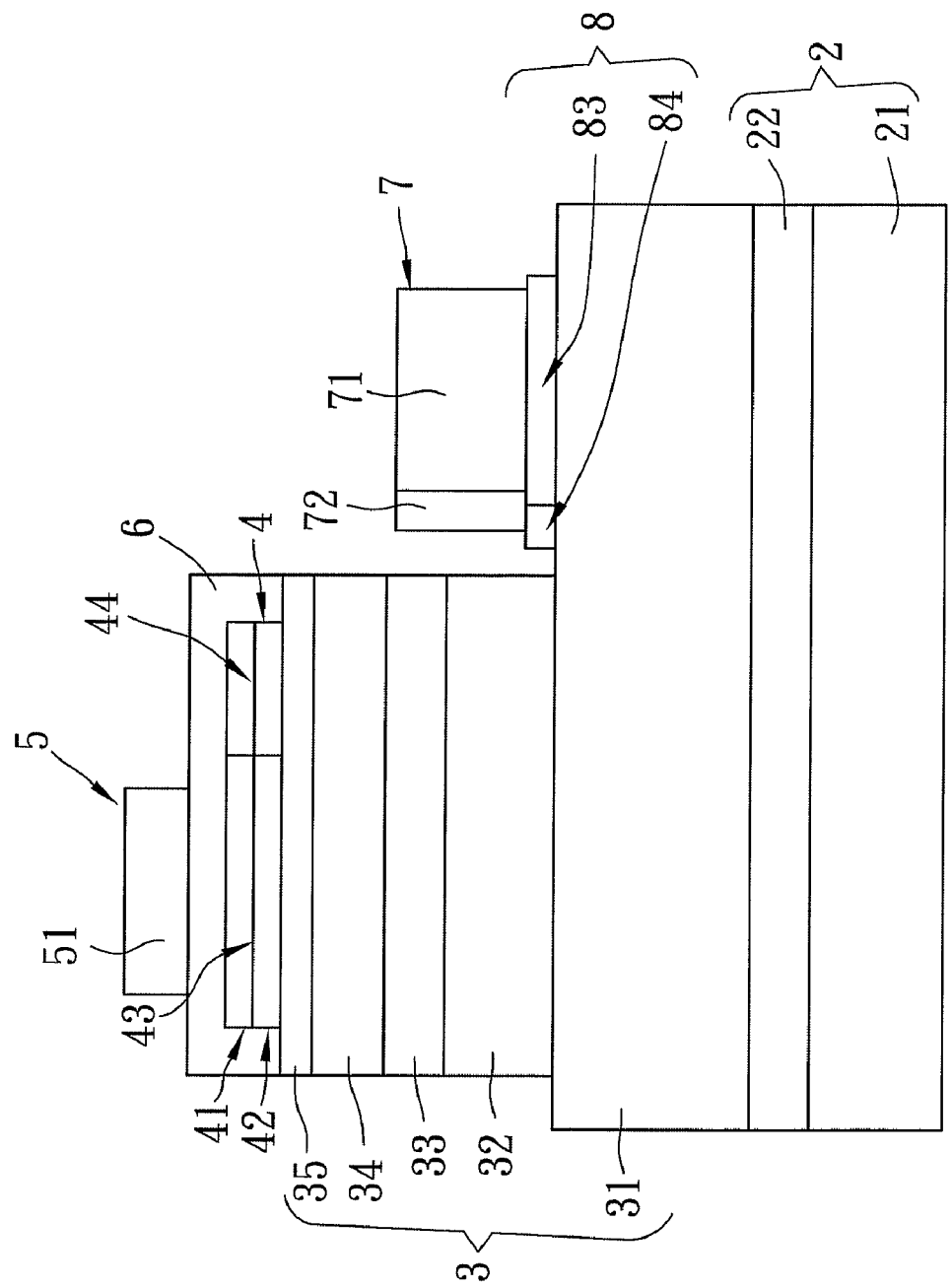
FIG. 8 is a schematic diagram of the second preferred embodiment of a light-emitting diode device according to this invention.
Figure 9:
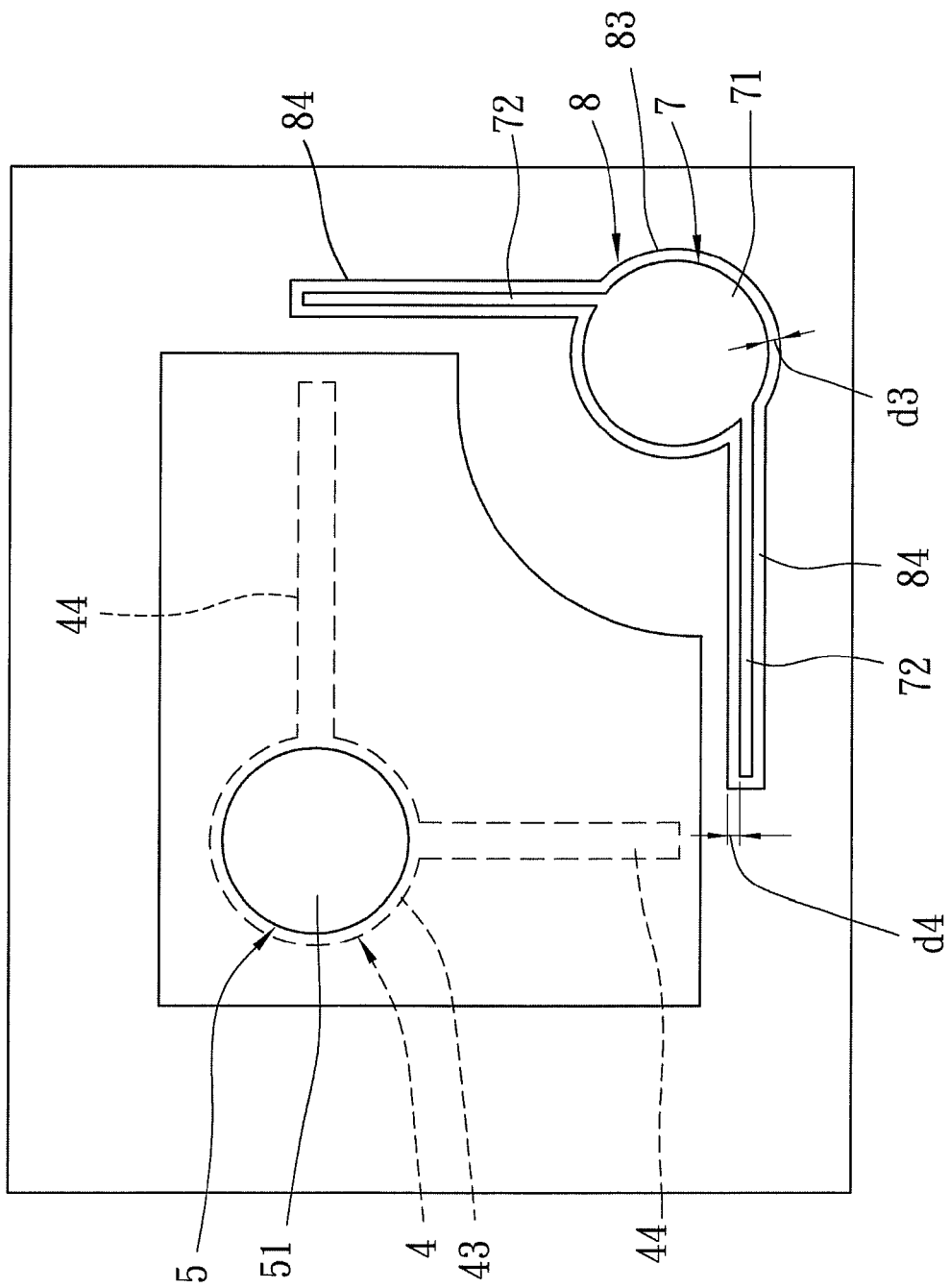
FIG. 9 is a plan view of the second preferred embodiment.

Referring to FIGS. 8 and 9, the second preferred embodiment of the present invention differs from the first preferred embodiment in that the first electrode 5 does not have the first electrode extension parts 52 and the light-emitting diode device further includes a reflective layer 8 formed on an exposed portion of the first contact layer 31. The reflective layer 8 is provided for reflecting light and for preventing the light emitted toward the second electrode 7 from being absorbed thereby. In this embodiment, the reflective layer 8 is made of a conductive material having light reflectivity. The material is selected from the group consisting of silver (Ag), gold (Au), aluminum (Al), and combinations thereof. Due to the metal having good light reflectivity, more than 90% of incident light can be reflected.

In addition, the reflective layer 8 has a second main portion 83 and two second extension portions 84 projecting from the second main portion 83.

The second electrode 7 is formed on the reflective layer 8 and has a second electrode main part 71 aligned above the second main portion 83 and two second electrode extension parts 72 respectively disposed over the two second extension portions 84. The second electrode extension parts 72 serve to assist in spreading uniform current. The second main portion 83 has a shape corresponding to and a size larger than that of the second electrode main part 71, and protrudes beyond the second electrode main part 71 to a third distance (d3). Likewise, each of the second extension portions 84 has a shape corresponding to and a size larger than that of the respective second electrode extension part 72, and protrudes beyond the respective second electrode extension part 72 to a fourth distance (d4). The second main portion 83 and the second electrode main part 71 are circular, square, oval, polygonal, or irregular in shape.

In this embodiment, the third distance (d3), which is the same as the first distance (d1), ranges from 2 µm to 13 µm, more preferably, from 3 µm to 12 µm, and most preferably, from 5 µm to 9 µm.

The fourth distance (d4), which is the same as the second distance (d2), ranges from 2 μm to 13 μm, more preferably, from 3 μm to 12 μm, and most preferably, from 5 μm to 9 μm.

In this embodiment, the geometric radius of the second electrode main part 71 is 35 μm. Therefore, according to this invention, the third distance (d3) ranges from 5.7% to 37.1% (from 2 μm to 13 μm) of the geometric radius, more preferably, from 8.6% to 34.3% (from 3 μm to 12 μm) of the geometric radius, and most preferably, from 14.3% to 25.7% (from 5 μm to 9 μm) of the geometric radius.

The geometric radius of each of the second electrode extension parts 72 is 3 μm. Therefore, the fourth distance (d4) ranges from 66.7% to 433.3% (from 2 μm to 13 μm) of the geometric radius of the second electrode extension parts 72, more preferably, from 100% to 400% (from 3 μm to 12 μm), and most preferably, from 166.7% to 300% (from 5 μm to 9 μm) of the geometric radius of the second electrode extension parts 72.

By virtue of the enlarged design of the reflective layer 8 which partially protrudes from the second electrode 7, the light emitted toward the second electrode 7 can be reflected, thereby avoiding undesired absorption of the light and increasing the light-emitting efficiency.

It is worth mentioning that when the light-emitting diode device is provided with the multi-functional layer 4 and the reflective layer 8, and when the first distance is identical to the third distance (d1=d3) and the second distance is identical to the fourth distance (d2=d4), the light output power of the present invention can be increased. By virtue of the multi-functional layer 4 (d1=3 μm, d2=3 μm), the light output power can be increased by about 2%. Moreover, by virtue of the reflecting layer 8 (d3=3 μm, d4=3 μm), the light output power can be increased even more by about 0.1%, which is 5% of the increased light output power due to the multi-functional layer 4. The overall increase in light output power can be raised by about 2.1% compared to a conventional light-emitting diode device.

Figure 10:
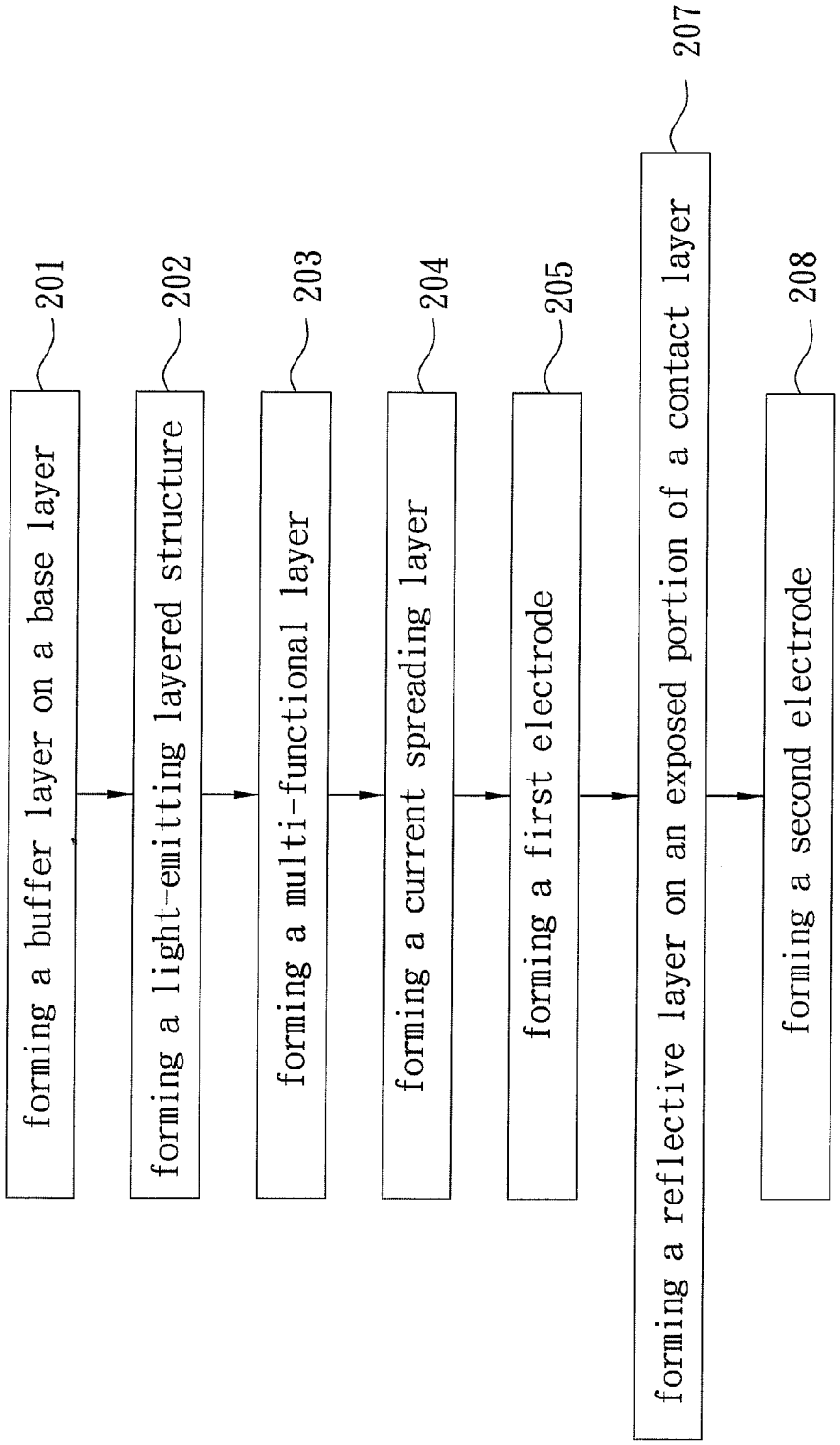
FIG. 10 is a flowchart to illustrate consecutive steps of the method of making the second preferred embodiment of the light-emitting diode device according to this invention.

Referring to FIGS. 8 to 10, a method of making the second preferred embodiment includes the aforesaid steps 201 to 205 and further includes steps 207 and 208.

In step 207, the reflective layer 8 is formed on the exposed portion of the first contact layer 31, and has the second main portion 83 and the second extension portions 84.

In step 208, the second electrode 7 is formed on the reflective layer 8 and has the second electrode main part 71 aligned above the second main portion and the second electrode extension parts 72 respectively aligned above the second extension portions 84 such that the second electrode 7 is entirely included in the reflective layer 8.

Figure 11:
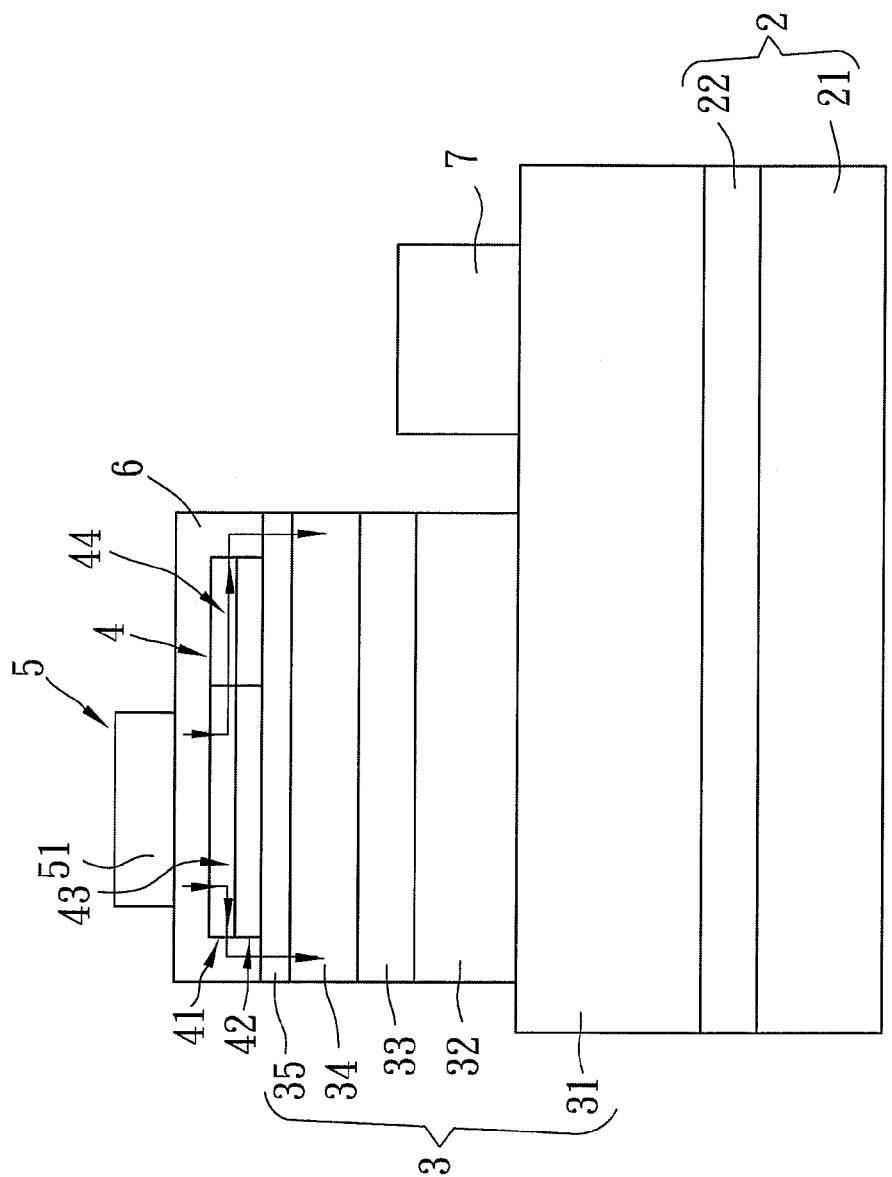
FIG. 11 is a schematic diagram of the third preferred embodiment of the light-emitting diode device according to this invention.
Figure 12:
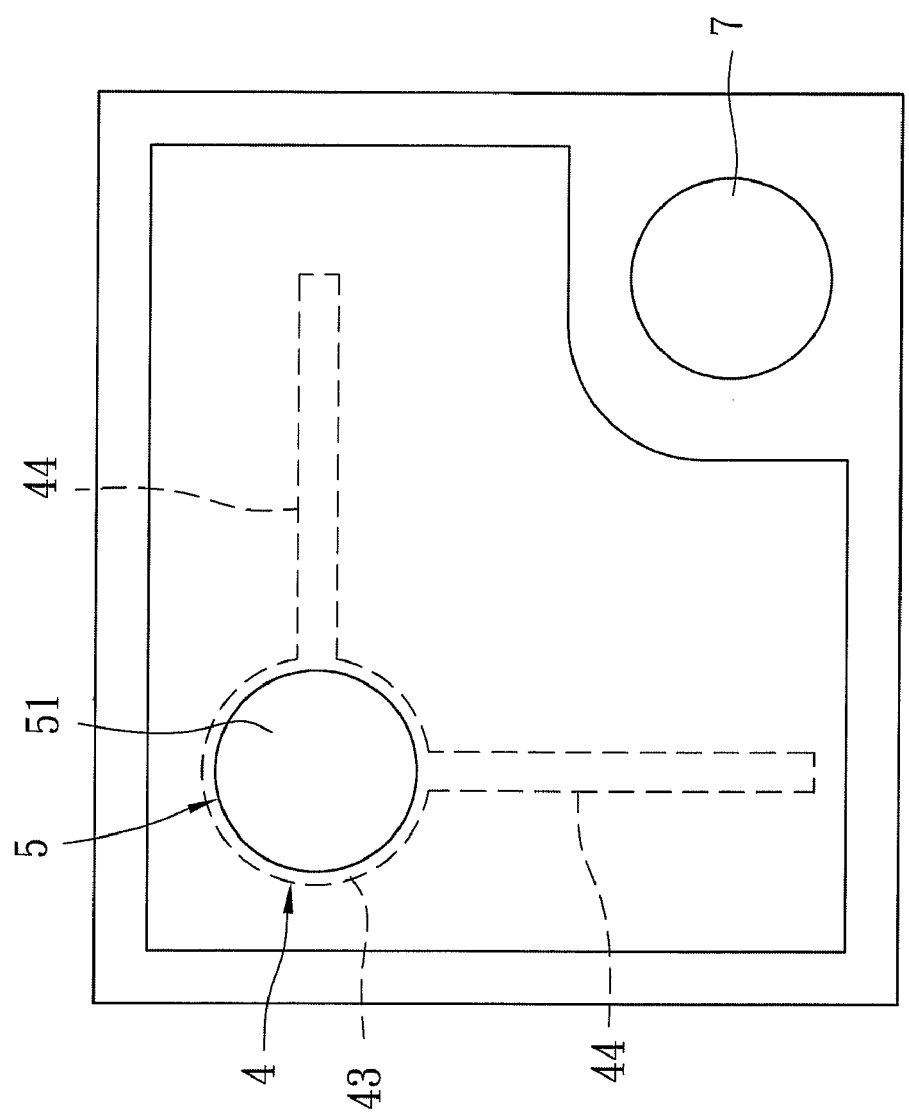
FIG. 12 is a plan view of the third preferred embodiment.

Referring to FIGS. 11 and 12, the third preferred embodiment of the present invention differs from the first preferred embodiment in that the first electrode 5 does not have the first electrode extension parts 52. In addition, the top sub-layer 41 of the multi-functional layer 4 includes at least one film made of a conductive metal selected from the group consisting of silver (Ag), aluminum (Al), gold (Au), rhodium (Rh), titanium (Ti), copper (Cu), indium (In), platinum (Pt), palladium (Pd), iridium (Ir), and combinations thereof. The bottom sub-layer 42 of the multi-functional layer 4 includes at least one film made of a dielectric material having light reflectivity. The dielectric material is selected from the group consisting of titanium dioxide ($TiO_2$), silicon dioxide ($SiO_2$), magnesium fluoride ($MgF_2$), tantalum oxide ($Ta_2O_3$), and combinations thereof. When the bottom sub-layer 42 of the multi-functional layer 4 includes more than two films that are made of various dielectric materials having different refractive indices, the different films can be stacked periodically, thereby improving the light reflecting effect.

Therefore, the bottom sub-layer 42 and the top sub-layer 41 cooperatively form a stack of films. For example, in a six-layered stack with a sequence of $SiO_2$/$TiO_2$/$SiO_2$/$TiO_2$/$SiO_2$/Al, $SiO_2$ and $TiO_2$ are stacked periodically in the bottom sub-layer 42, and the top sub-layer 41 has an Al film. The stack of films can be selected from the group consisting of the following stacks: $SiO_2$/$TiO_2$/$SiO_2$/$TiO_2$/$SiO_2$/Al, $SiO_2$/$TiO_2$/$SiO_2$/Al, $SiO_2$/$Ta_2O_3$/$SiO_2$/$Ta_2O_3$/$SiO_2$/Al, $SiO_2$/$Ta_2O_3$/$SiO_2$/Al, $SiO_2$/$MgF_2$/$SiO_2$/$MgF_2$/$SiO_2$/Al, $SiO_2$/$MgF_2$/$SiO_2$/Al, $SiO_2$/Al, $SiO_2$/Ag, and $SiO_2$/Au/Ag. The metal film/films in each stack is the material of the top sub-layer 41, and the non-metal film/films in each stack serves as the bottom sub-layer 42. The top sub-layer 41 has a good electrical conductivity and is electrically coupled to the current spreading layer 6. Moreover, in this embodiment, the top sub-layer 41 made of the conductive metal also has a good light reflectivity. It is noted that the top sub-layer 41 is not limited to be made of a conductive material and can be made of an insulating material.

It is worth mentioning that the bottom sub-layer 42 merely including one film may have a light reflective effect less than that of the bottom sub-layer 42 including more than two films. However, since the top sub-layer 41 also has light reflectivity, the light which is not reflected by the bottom sub-layer 42 can be reflected by the top sub-layer 41 when it reaches an interface between the bottom and top sub-layers 42, 41. Likewise, a sidelight emitted toward the top sub-layer 41 can also be reflected thereby.

Referring back to FIG. 11, the applied current flowing through the current spreading layer 6 and the conductive top sub-layer 41 is blocked by the bottom sub-layer 42 and then flows laterally along a peripheral wall of the bottom sub-layer 42 and downwardly toward the light-emitting layered structure 3.

Therefore, the multi-functional layer 4 of the present invention should have a size larger than that of the first electrode 5 and should partially protrude beyond the first electrode 5. In addition, one of the top and bottom sub-layers 41, 42 of the multi-functional layer 4 is required to be made of an insulating material for blocking current and spreading current uniformly. The multi-functional layer is required to have good light reflectivity.

Figure 13:
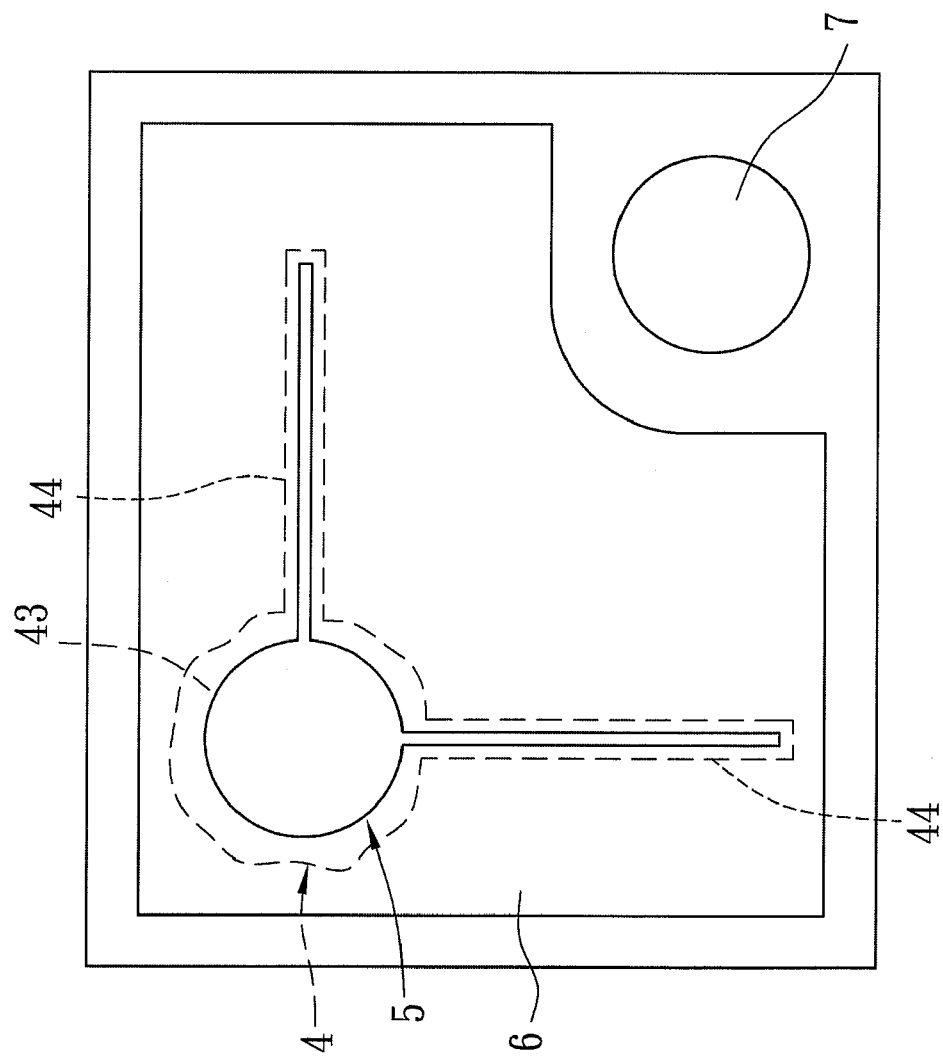
FIG. 13 is a plan view of the fourth preferred embodiment of the light-emitting diode device according to this invention.

Referring to FIG. 13, the fourth preferred embodiment of the present invention differs from the first preferred embodiment in that the first main portion 43 has an irregular peripheral profile.

Figure 14:
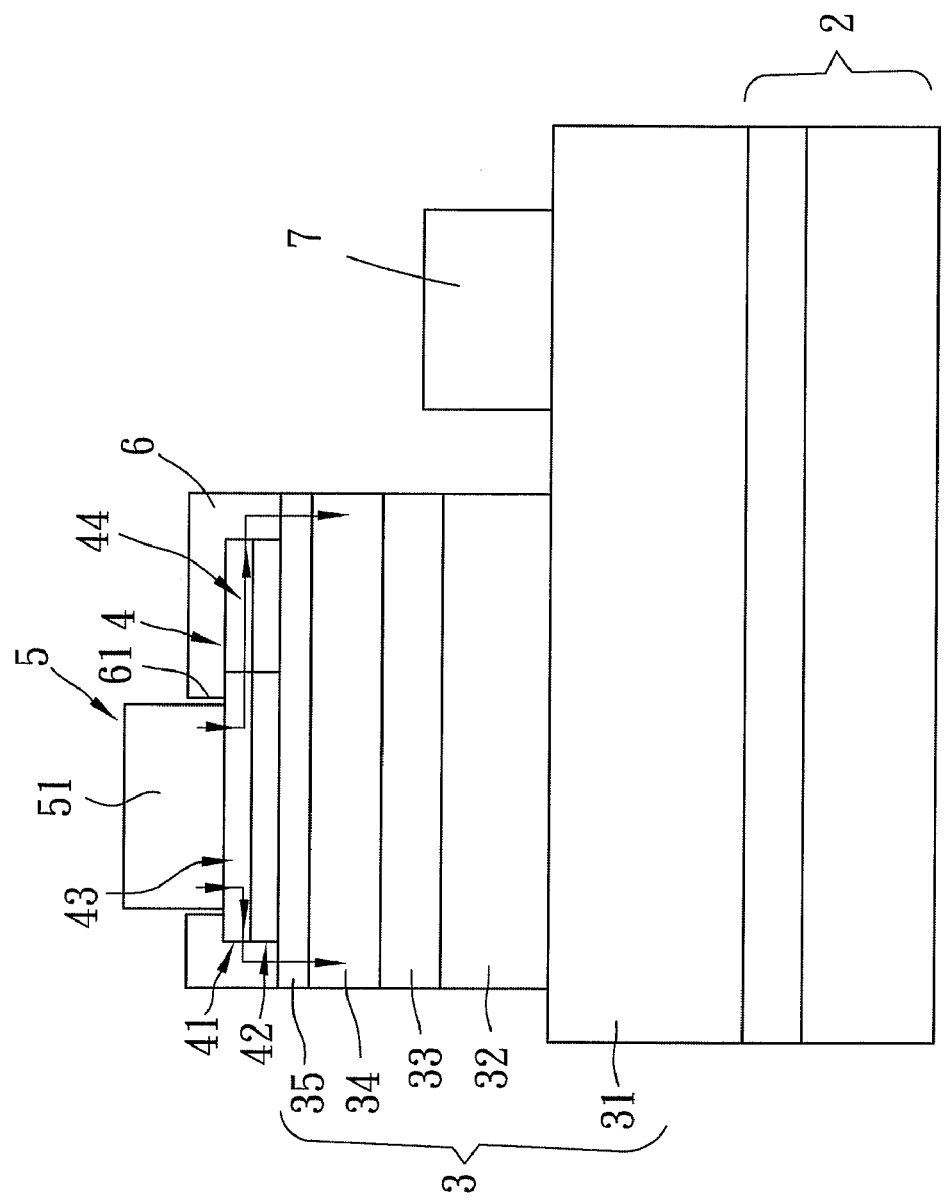
FIG. 14 is a schematic diagram of the fifth preferred embodiment according to this invention.
Figure 15:
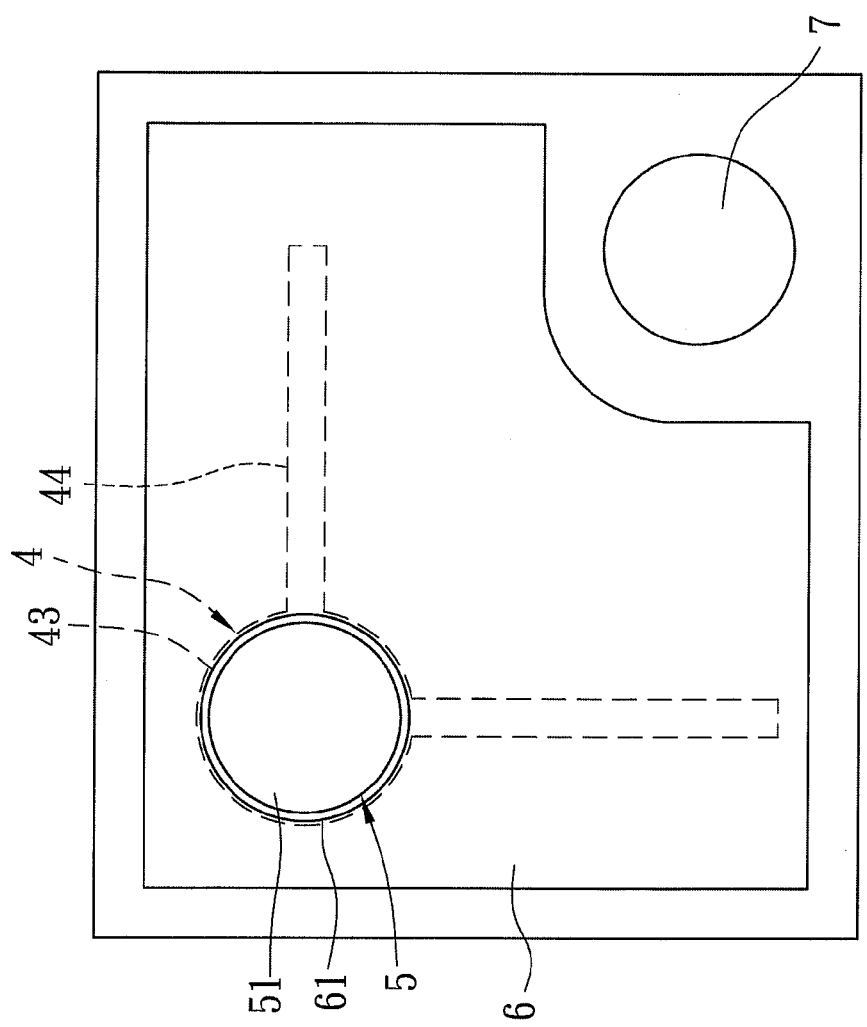
FIG. 15 is a plan view of the fifth preferred embodiment.

Referring to FIGS. 14 and 15, the fifth preferred embodiment of the present invention differs from the third preferred embodiment in that the current spreading layer 6 which is formed on the second contact layer 35 and the multi-functional layer 4 wholly covers the first extension portion 44 but covers portions of the first main portion 43. The current spreading layer 6 has an inner surrounding wall 61 defining an opening so as to expose a portion of the first main portion 43. The first electrode 5 is formed on the first main portion 43 uncovered by the current spreading layer 6 and is surrounded by the inner surrounding wall 61.

In this embodiment, the applied current flowing through the top sub-layer 41 is blocked by the insulator bottom sub-layer 42 and then flows laterally and downwardly toward the light-emitting layered structure 3.

The method of making the fifth preferred embodiment differs from the third preferred embodiment in that the current spreading layer 6 is etched to expose a portion of the multi-functional layer 4 and the first electrode 5 is formed on the exposed portion of the multi-functional layer 4.

Figure 16:
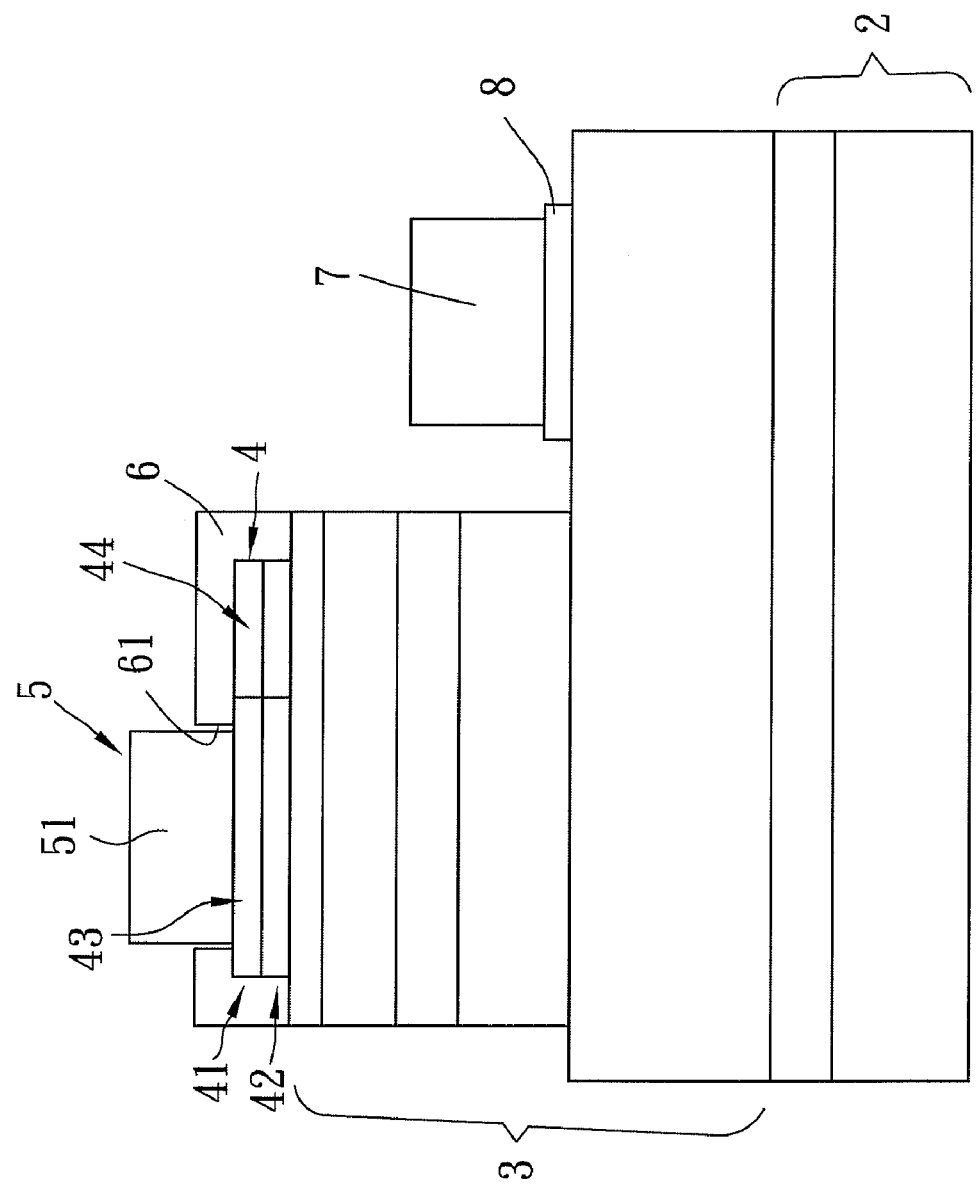
FIG. 16 is a schematic diagram of the sixth preferred embodiment of the light-emitting diode device according to this invention.
Figure 17:
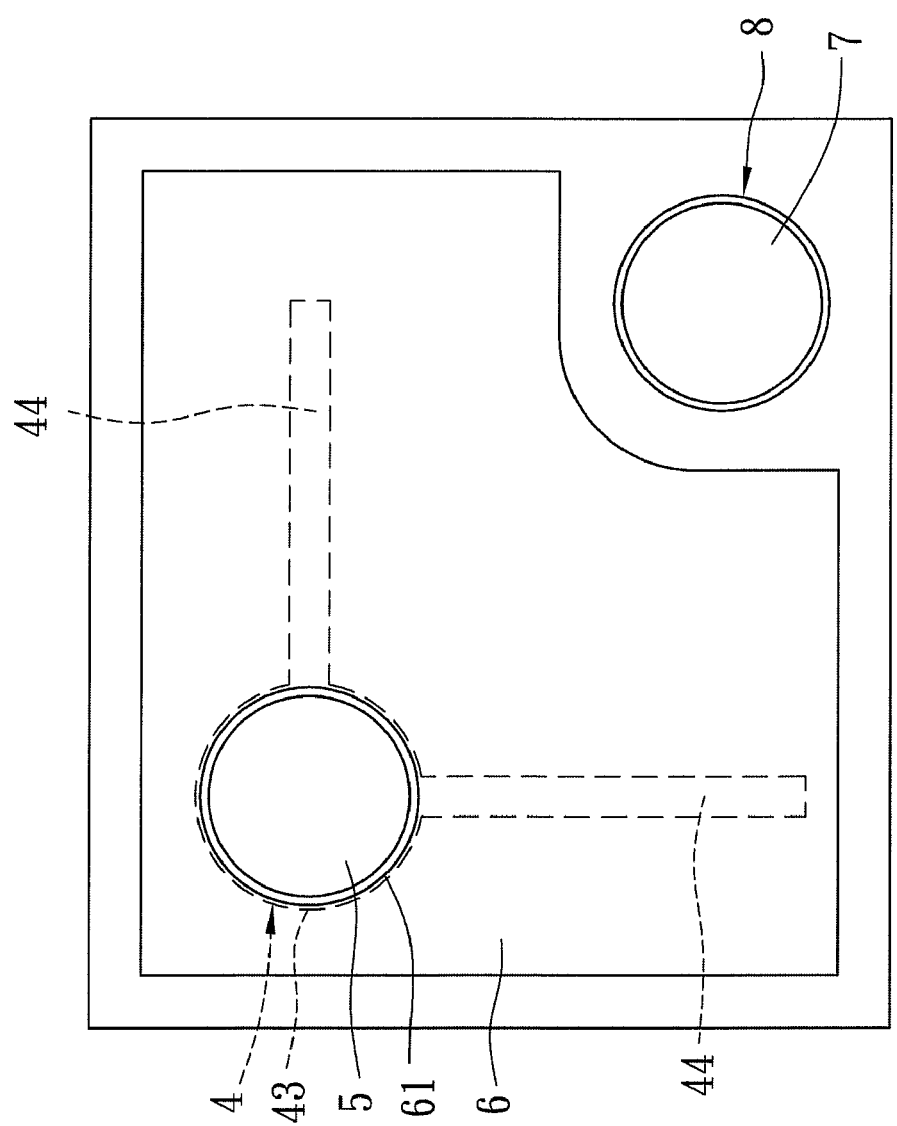
FIG. 17 is a plan view of the sixth preferred embodiment.

Referring to FIGS. 16 and 17, the sixth preferred embodiment of the present invention differs from the fifth preferred embodiment in that the light-emitting diode device further includes the reflective layer 8. The reflective layer 8 is made of a conductive material and is provided for reflecting light emitted toward the second electrode 7. The reflective layer 8 is provided with a size larger than that of the second electrode 7.

With the invention thus explained, it is apparent that various modifications and variations can be made without departing from the spirit of the present invention. It is therefore intended that the invention be limited only as recited in the appended claims.

What is claimed is:

1. A light-emitting diode device comprising:
a substrate;
a light-emitting layered structure formed on said substrate;
a multi-functional layer having a first main portion and formed on said light-emitting layered structure for spreading current laterally and for reflecting light emitted from said light-emitting layered structure; and
first and second electrodes electrically coupled to said light-emitting layered structure;
wherein said first electrode is formed on said light-emitting layered structure and has a first electrode main part, said first main portion of said multi-functional layer being aligned below and provided with a size larger than that of said first electrode main part.

2. The light-emitting diode device of claim 1, wherein said first main portion of said multi-functional layer protrudes beyond said first electrode main part to a first distance not larger than 65% of a geometric radius of said first electrode main part.

3. The light-emitting diode device of claim 2, wherein said first distance ranges from 5.7% to 37.1% of the geometric radius of said first electrode main part.

4. The light-emitting diode device of claim 3, wherein said first distance ranges from 8.6% to 34.3% of the geometric radius of said first electrode main part.

5. The light-emitting diode device of claim 4, wherein said first distance ranges from 14.3% to 25.7% of the geometric radius of said first electrode main part.

6. The light-emitting diode device of claim 1, wherein said first main portion of said multi-functional layer protrudes beyond said first electrode main part to a first distance ranging from 2 μm to 13 μm.

7. The light-emitting diode device of claim 6, wherein said first distance ranges from 3 μm to 12 μm.

8. The light-emitting diode device of claim 7, wherein said first distance ranges from 5 μm to 9 μm.

9. The light-emitting diode device of claim 1, wherein said first electrode further has a first electrode extension part projecting from said first electrode main part, said multi-functional layer further having a first extension portion that protrudes from said first main portion, and that is aligned below and provided with a size larger than that of said first electrode extension part.

10. The light-emitting diode device of claim 9, wherein said first extension portion protrudes beyond said first electrode extension part to a second distance ranging from 66.7% to 433.3% of a geometric radius of said first electrode extension part.

11. The light-emitting diode device of claim 10, wherein said second distance ranges from 100% to 400% of the geometric radius of said first electrode extension part.

12. The light-emitting diode device of claim 11, wherein said second distance ranges from 166.7% to 300% of the geometric radius of said first electrode extension part.

13. The light-emitting diode device of claim 9, wherein said first extension portion protrudes beyond said first electrode extension part to a second distance ranging from 2 μm to 13 μm.

14. The light-emitting diode device of claim 13, wherein said second distance ranges from 3 μm to 12 μm.

15. The light-emitting diode device of claim 14, wherein said second distance ranges from 5 μm to 9 μm.

16. The light-emitting diode device of claim 1, wherein said multi-functional layer includes a bottom reflecting sub-layer formed on said light-emitting layered structure for reflecting light emitted therefrom, and a top insulation sub-layer formed on top of said bottom reflecting sub-layer for spreading current laterally.

17. The light-emitting diode device of claim 16, wherein said bottom reflecting sub-layer includes a metal and said top insulation sub-layer includes an oxide of said metal.

18. The light-emitting diode device of claim 1, wherein said multi-functional layer includes a bottom insulating sub-layer formed on said light-emitting layered structure and capable of reflecting light emitted therefrom, and a top conductive sub-layer formed on said bottom insulating sub-layer.

19. The light-emitting diode device of claim 18, wherein said bottom insulating sub-layer includes at least one film made of a material selected from the group consisting of titanium dioxide, silicon dioxide, magnesium fluoride, tantalum oxide, and combinations thereof.

20. The light-emitting diode device of claim 1, wherein said light-emitting layered structure includes a first contact layer formed on said substrate, said light-emitting diode device further comprising a reflective layer formed between said second electrode and said first contact layer and having a second main portion, said second electrode having a second electrode main part, said second main portion being aligned below and provided with a size larger than that of said second electrode main part.

21. The light-emitting diode device of claim 20, wherein said reflective layer further has a second extension portion projecting from said second main portion, said second electrode further having a second electrode extension part protruding from said second electrode main part, said second extension portion being aligned below and provided with a size larger than that of said second electrode extension part.

22. The light-emitting diode device of claim 21, wherein said second extension portion protrudes beyond said second electrode extension part to a fourth distance ranging from 66.7% to 433.3% of a geometric radius of said second electrode extension part.

23. The light-emitting diode device of claim 22, wherein the fourth distance ranges from 100% to 400% of the geometric radius of said second electrode extension part.

24. The light-emitting diode device of claim 23, wherein the fourth distance ranges from 166.7% to 300% of the geometric radius of said second electrode extension part.

25. The light-emitting diode device of claim 21, wherein said second extension portion protrudes beyond said second electrode extension part to a fourth distance ranging from 2 μm to 13 μm.

26. The light-emitting diode device of claim 25, wherein said fourth distance ranges from 3 μm to 12 μm.

27. The light-emitting diode device of claim 26, wherein said fourth distance ranges from 5 μm to 9 μm.

28. The light-emitting diode device of claim 20, wherein said reflective layer is made of a material selected from the group consisting of silver, gold, aluminum, and combinations thereof.

29. The light-emitting diode device of claim 20, wherein said second main portion protrudes beyond said second electrode main part to a third distance ranging from 2 µm to 13 µm.

30. The light-emitting diode device of claim 29, wherein said third distance ranges from 3 µm to 12 µm.

31. The light-emitting diode device of claim 30, wherein said third distance ranges from 5 µm to 9 µm.

32. The light-emitting diode device of claim 20, wherein said second main portion protrudes beyond said second electrode main part to a third distance not larger than 65% of a geometric radius of said second electrode main part.

33. The light-emitting diode device of claim 32, wherein the third distance ranges from 5.7% to 37.1% of the geometric radius of said second electrode main part.

34. The light-emitting diode device of claim 33, wherein the third distance ranges from 8.6% to 34.3% of the geometric radius of said second electrode main part.

35. The light-emitting diode device of claim 34, wherein the third distance ranges from 14.3% to 25.7% of the geometric radius of said second electrode main part.

36. The light-emitting diode device of claim 1, wherein said multi-functional layer includes a stack of films selected from the group consisting of the following stacks: $SiO_2/TiO_2/SiO_2/TiO_2/SiO_2/Al$, $SiO_2/TiO_2/SiO_2/Al$, $SiO_2/Ta_2O_3/SiO_2/Ta_2O_3/SiO_2/Al$, $SiO_2/Ta_2O_3/SiO_2/Al$, $SiO_2/MgF_2/SiO_2/MgF_2/SiO_2/Al$, $SiO_2/MgF_2/SiO_2/Al$, $SiO_2/Al$, $SiO_2/Ag$, and $SiO_2/Au/Ag$.

37. The light-emitting diode device of claim 1, further comprising a current spreading layer formed on said light-emitting layered structure and electrically coupled to said first electrode.

38. The light-emitting diode device of claim 37, wherein said current spreading layer is disposed between said light-emitting layered structure and said first electrode and wholly covers said multi-functional layer, said first electrode being disposed on said current spreading layer.

39. The light-emitting diode device of claim 37, wherein said current spreading layer is disposed between said light-emitting layered structure and said first electrode and covers portions of said multi-functional layer, said first electrode being disposed on said multi-functional layer exposed from said current spreading layer.

40. The light-emitting diode device of claim 1, wherein said light-emitting layered structure includes a first contact layer, a first cladding layer, an active layer, a second cladding layer, and a second contact layer, said second electrode being formed on an exposed portion of said first contact layer.

41. The light-emitting diode device of claim 1, wherein said first main portion of said multi-functional layer that protrudes beyond said first electrode main part has an irregular peripheral profile.

* * * * *